(12) United States Patent
Varteva

(10) Patent No.: US 8,483,311 B2
(45) Date of Patent: Jul. 9, 2013

(54) METHOD, APPARATUS AND COMPUTER PROGRAM PRODUCT FOR PROVIDING A DATA ENCODING/DECODING SCHEME

(75) Inventor: Jaakko Valtteri Varteva, Veikkola (FI)

(73) Assignee: Nokia Corporation, Espoo (FI)

( * ) Notice: Subject to any disclaimer, the term of this patent is extended or adjusted under 35 U.S.C. 154(b) by 323 days.

(21) Appl. No.: 12/921,377

(22) PCT Filed: Mar. 6, 2008

(86) PCT No.: PCT/IB2008/000531
§ 371 (c)(1),
(2), (4) Date: Sep. 7, 2010

(87) PCT Pub. No.: WO2009/109797
PCT Pub. Date: Sep. 11, 2009

(65) Prior Publication Data
US 2011/0019765 A1 Jan. 27, 2011

(51) Int. Cl.
*H04L 27/00* (2006.01)
(52) U.S. Cl.
USPC ........... 375/295; 375/219; 375/220; 375/259; 375/269; 375/272; 375/300; 375/303; 375/316; 375/320; 375/334; 375/340; 455/91; 455/130; 329/300; 329/315

(58) Field of Classification Search
USPC ............... 375/219, 220, 259, 269, 272, 295, 375/300, 303, 316, 320, 334, 340; 455/91, 455/130; 329/300, 315
See application file for complete search history.

(56) References Cited

U.S. PATENT DOCUMENTS

| 5,822,373 | A | * | 10/1998 | Addy | 375/259 |
| 2007/0176735 | A1 | * | 8/2007 | Blaker et al. | 340/5.22 |

OTHER PUBLICATIONS

International Search Report and Written Opinion of the International Searching Authority for corresponding International Patent Cooperation Treaty Application PCT/IB2008/000531, dated Jun. 9, 2008, 12 pages.
Prakash, "Energy Efficient Source Coding and Modulation for Wireless Applicaitons", 2003 IEEE Wireless Communicaitons and Networking Conference, vol. 1, 2003, pp. 212-217.
Stan, "Bus invert coding for low-power I/O", IEEE Transactions on Very Large Scale Integration (VLSI) Systems, vol. 3, No. 1, Mar. 1995, pp. 49-58.
IEEE802.11, IEEE Standard for Information technology—Telecommunications and information exchange between systems—Local and metropolitan area networks—Specific requirements Part 11: Wireless LAN Medium Access Control (MAC) and Physical Layer (PHY) Specifications, Jun. 12, 2007.
Erin et al., "Energy-Optimal point-to-point Wireless Data Communications", ICC 2001, 2001 IEEE International Conference on Communicaitons. Conference Record. Helsinki, Finland, Jun. 11-14, 2001, [IEEE International Conference on Communications] New York, NY, IEEE, US, vol. 8, Jun. 11, 2001, pp. 2410-2415.
International Preliminary Report on Patentability for corresponding International Patent Cooperation Treaty Application PCT/IB2008/000531, dated Jan. 26, 2010, 8 pages.

* cited by examiner

*Primary Examiner* — Leon Flores
(74) *Attorney, Agent, or Firm* — Alston & Bird LLP

(57) ABSTRACT

An apparatus for providing a data encoding scheme may include an encoder. The encoder may be configured to determine, for a digital input value comprising a particular number of bits, whether more than half of the bits of the digital input value have a high value. The encoder may be further configured to encode the digital input value by inverting each of the bits of the digital input value in response to a determination that more than half of the bits of the digital input value have the high value. Corresponding method and computer program product, and a decoder and decoding method are also provided.

18 Claims, 8 Drawing Sheets

METHOD, APPARATUS AND COMPUTER PROGRAM PRODUCT FOR PROVIDING A DATA ENCODING/DECODING SCHEME

RELATED APPLICATION

This application was originally filed as PCT Application No. PCT/IB32008/000531 filed Mar. 6, 2008.

FIELD OF THE INVENTION

Embodiments of the present invention relate generally to data encoding and decoding technology and, more particularly, relate to a method, apparatus and computer program product for providing encoding and/or decoding of data that may, for example, provide reduced power and energy consumption.

BACKGROUND OF THE INVENTION

The modern communications era has brought about a tremendous expansion of wireline and wireless networks. Computer networks, television networks, and telephony networks are experiencing an unprecedented technological expansion, fueled by consumer demand. Wireless and mobile networking technologies have addressed related consumer demands, while providing more flexibility and immediacy of information transfer.

Current and future networking technologies continue to facilitate ease of information transfer and convenience to users. One area in which there is a demand to increase ease of information transfer relates to data processing services for data being communicated to/from a mobile terminal. The data processing services may be provided from a network server or other network device, from the mobile terminal such as, for example, a mobile telephone, a mobile television, a mobile gaming system, etc, or even from a combination of the mobile terminal and the network device. The data processing services may include transmission, reception, coding, decoding, storage, or other processing of, for example, image files, speech, video or audio signals, etc.

In current applications, when a mobile terminal wirelessly communicates with other devices in order to transmit or receive data comprising images, speech, audio, video, etc., mobile terminal resources are consumed. One such resource is power, which is typically provided by a battery of a finite capacity. Thus, if power consumption can be reduced, battery life may be extended. However, in certain situations, communications involving relatively large quantities of data may be unavoidable and even desirable. Thus, it may be difficult to reduce power consumption without reducing communication capacity. Accordingly, it may be desirable to develop communication techniques for reducing power consumption.

BRIEF SUMMARY OF THE INVENTION

A method, apparatus and computer program product are therefore provided that may enable data encoding (and subsequent decoding) that may reduce power and energy consumption. In an exemplary embodiment, input data of a given number of bits (e.g., N-bits) may be encoded in a manner that may reduce power consumption. In this regard, for example, since in conjunction with at least some modulation methods it may require more energy to transmit a digital "one" (or high) value modulated onto a carrier than the energy required to transmit a digital "zero" (or low) value, embodiments of the present invention enable encoding of input data or an input word in a manner that ensures that not more than half of the bits transmitted will be high value bits. As such, for example, if more than half of the bits of the input data or input word have a high value, the entire input word may be encoded by inverting the bit values and adding an indication bit to indicate the status of encoding (e.g., indicating an inversion). Meanwhile, if half or less than half of the bits of the input word initially have high values, the input word is encoded by adding only the indication bit to indicate the status of encoding (e.g., indicating no inversion).

In one exemplary embodiment, a method for providing a data encoding scheme that may, for example, reduce power consumption is provided. The method may include determining, for a digital input value comprising a particular number of bits, whether more than half of the bits of the digital input value have a high value, and encoding the digital input value by inverting each of the bits of the digital input value in response to a determination that more than half of the bits of the digital input value have the high value.

In another exemplary embodiment, a computer program product for providing a data encoding scheme that may, for example, reduce power consumption is provided. The computer program product includes at least one computer-readable storage medium having computer-readable program code portions stored therein. The computer-readable program code portions include first and second executable portions. The first executable portion is for determining, for a digital input value comprising a particular number of bits, whether more than half of the bits of the digital input value have a high value. The second executable portion is for encoding the digital input value by inverting each of the bits of the digital input value in response to a determination that more than half of the bits of the digital input value have the high value.

In another exemplary embodiment, an apparatus for providing a data encoding scheme that may, for example, reduce power consumption is provided. The apparatus may include an encoder configured to determine, for a digital input value comprising a particular number of bits, whether more than half of the bits of the digital input value have a high value. The encoder may be further configured to encode the digital input value by inverting each of the bits of the digital input value in response to a determination that more than half of the bits of the digital input value have the high value.

In another exemplary embodiment, an apparatus for providing a data decoding scheme that may, for example, reduce power consumption is provided. The apparatus may include a decoder configured to receive an encoded digital value comprising a particular number of bits and determine whether the encoded digital value corresponds to a value that was inverted prior to receipt of the encoded digital value. The decoder may be further configured to invert each of the bits of the encoded digital value in response to a determination that the encoded digital value was inverted prior to receipt of the encoded digital value.

In yet another exemplary embodiment, a method for providing a data decoding scheme that may, for example, reduce power consumption is provided. The method may include receiving an encoded digital value comprising a particular number of bits, determining whether the encoded digital value corresponds to a value that was inverted prior to receipt of the encoded digital value, and inverting each of the bits of the encoded digital value in response to a determination that the encoded digital value was inverted prior to receipt of the encoded digital value.

In still another exemplary embodiment, a computer program product for providing a data decoding scheme that may, for example, reduce power consumption is provided. The computer program product includes at least one computer-readable storage medium having computer-readable program code portions stored therein. The computer-readable program code portions include first, second and third executable portions. The first executable portion is for receiving an encoded digital value comprising a particular number of bits. The second executable portion is for determining whether the encoded digital value corresponds to a value that was inverted prior to receipt of the encoded digital value. The third executable portion is for inverting each of the bits of the encoded digital value in response to a determination that the encoded digital value was inverted prior to receipt of the encoded digital value.

Embodiments of the present invention may enable encoding of data in a manner that may reduce overall power and energy consumption. Accordingly, power may, for example, be used in a more efficient manner, or the consumption of power may be reduced.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1:
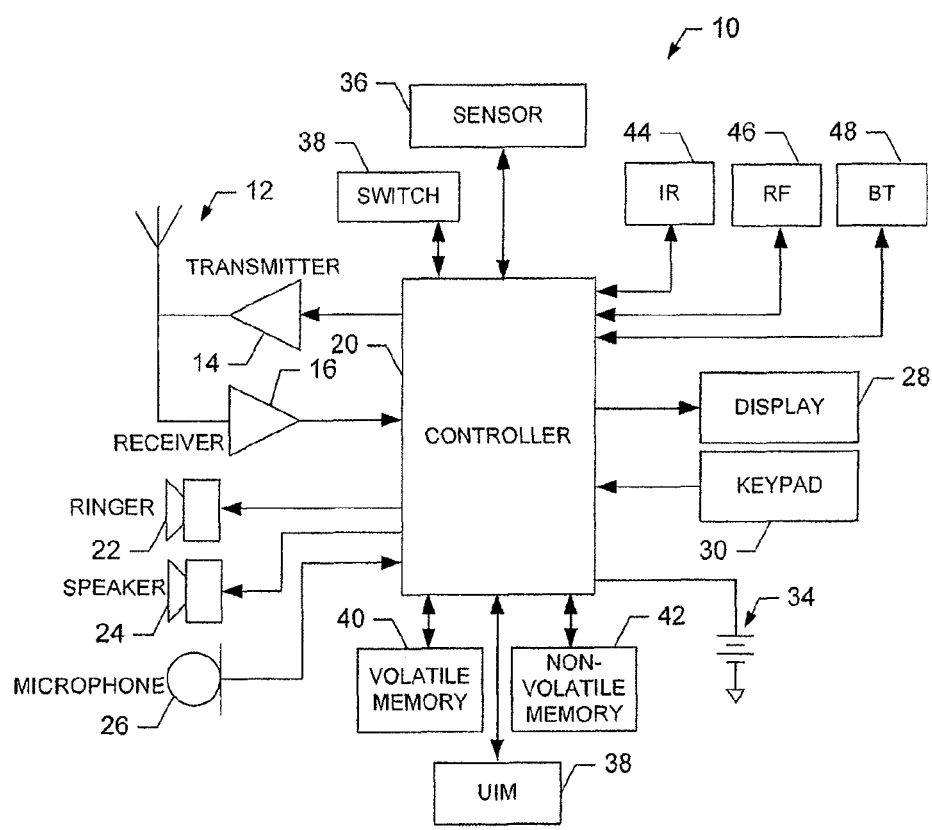
FIG. 1 is a schematic block diagram of a mobile terminal according to an exemplary embodiment of the present invention.

Embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

FIG. 1, one aspect of the invention, illustrates a block diagram of a mobile terminal 10 that may benefit from embodiments of the present invention. It should be understood, however, that a mobile telephone as illustrated and hereinafter described is merely illustrative of one type of mobile terminal that would benefit from embodiments of the present invention and, therefore, should not be taken to limit the scope of embodiments of the present invention. While several embodiments of the mobile terminal 10 are illustrated and will be hereinafter described for purposes of example, other types of mobile terminals, such as portable digital assistants (PDAs), pagers, mobile televisions, gaming devices, laptop computers, cameras, video recorders, audio/video player, radio, GPS devices, or any combination of the aforementioned, and other types of voice and text communications systems, can readily employ embodiments of the present invention.

In addition, while several embodiments of the method of the present invention are performed or used by a mobile terminal 10, the method may be employed by other than a mobile terminal. Moreover, the system and method of embodiments of the present invention will be primarily described in conjunction with mobile communications applications. It should be understood, however, that the system and method of embodiments of the present invention can be utilized in conjunction with a variety of other applications, both in the mobile communications industries and outside of the mobile communications industries.

The mobile terminal 10 may include an antenna 12 (or multiple antennae) in operable communication with a transmitter 14 and a receiver 16. The mobile terminal 10 may further include an apparatus, such as a controller 20 or other processing element, that provides signals to and receives signals from the transmitter 14 and receiver 16, respectively. The signals include signaling information in accordance with the air interface standard of the applicable cellular system, and also user speech, received data and/or user generated data. In this regard, the mobile terminal 10 is capable of operating with one or more air interface standards, communication protocols, modulation types, and access types. By way of illustration, the mobile terminal 10 is capable of operating in accordance with any of a number of first, second, third and/or fourth-generation communication protocols or the like. For example, the mobile terminal 10 may be capable of operating in accordance with second-generation (2G) wireless communication protocols IS-136 (time division multiple access (TDMA)), GSM (global system for mobile communication), and IS-95 (code division multiple access (CDMA)), or with third-generation (3G) wireless communication protocols, such as Universal Mobile Telecommunications System (UMTS), CDMA2000, wideband CDMA (WCDMA) and time division-synchronous CDMA (TD-SCDMA), with fourth-generation (4G) wireless communication protocols or the like. As an alternative (or additionally), the mobile terminal 10 may be capable of operating in accordance with non-cellular communication mechanisms. For example, the mobile terminal 10 may be capable of communication in a wireless local area network (WLAN) or other communication networks described below in connection with FIG. 2.

It is understood that the apparatus, such as the controller 20, may include circuitry desirable for implementing audio and logic functions of the mobile terminal 10. For example, the controller 20 may be comprised of a digital signal processor device, a microprocessor device, and various analog to digital converters, digital to analog converters, and other support circuits. Control and signal processing functions of the mobile terminal 10 are allocated between these devices according to their respective capabilities. The controller 20 thus may also include the functionality to convolutionally encode and interleave message and data prior to modulation and transmission. The controller 20 can additionally include an internal voice coder, and may include an internal data modem. Further, the controller 20 may include functionality to operate one or more software programs, which may be stored in memory. For example, the controller 20 may be capable of operating a connectivity program, such as a conventional Web browser. The connectivity program may then allow the mobile terminal 10 to transmit and receive Web content, such as location-based content and/or other web page content, according to a Wireless Application Protocol (WAP), Hypertext Transfer Protocol (HTTP) and/or the like, for example.

The mobile terminal 10 may also comprise a user interface including an output device such as a conventional earphone or speaker 24, a ringer 22, a microphone 26, a display 28, and a user input interface, all of which are coupled to the controller 20. The user input interface, which allows the mobile terminal 10 to receive data, may include any of a number of devices allowing the mobile terminal 10 to receive data, such as a keypad 30, a touch display (not shown) or other input device. In embodiments including the keypad 30, the keypad 30 may include the conventional numeric (0-9) and related keys (#, *), and other hard and soft keys used for operating the mobile terminal 10. Alternatively, the keypad 30 may include a conventional QWERTY keypad arrangement. The keypad 30 may also include various soft keys with associated functions. In addition, or alternatively, the mobile terminal 10 may include an interface device such as a joystick or other user input interface. The mobile terminal 10 further includes a battery 34, such as a vibrating battery pack, for powering various circuits that are required to operate the mobile terminal 10, as well as optionally providing mechanical vibration as a detectable output.

The mobile terminal 10 may further include a user identity module (UIM) 38. The UIM 38 is typically a memory device having a processor built in. The UIM 38 may include, for example, a subscriber identity module (SIM), a universal integrated circuit card (UICC), a universal subscriber identity module (USIM), a removable user identity module (R-UIM), etc. The UIM 38 typically stores information elements related to a mobile subscriber. In addition to the UIM 38, the mobile terminal 10 may be equipped with memory. For example, the mobile terminal 10 may include volatile memory 40, such as volatile Random Access Memory (RAM) including a cache area for the temporary storage of data. The mobile terminal 10 may also include other non-volatile memory 42, which can be embedded and/or may be removable. The non-volatile memory 42 can additionally or alternatively comprise an electrically erasable programmable read only memory (EEPROM), flash memory or the like, such as that available from the SanDisk Corporation of Sunnyvale, Calif., or Lexar Media Inc. of Fremont, Calif. The memories can store any of a number of pieces of information, and data, used by the mobile terminal 10 to implement the functions of the mobile terminal 10. For example, the memories can include an identifier, such as an international mobile equipment identification (IMEI) code, capable of uniquely identifying the mobile terminal 10.

As shown in FIG. 1, the mobile terminal 10 may also include one or more means for sharing and/or obtaining data. For example, the mobile terminal may comprise a short-range radio frequency (RF) transceiver and/or interrogator 44 so data may be shared with and/or obtained from electronic devices in accordance with RF techniques. The mobile terminal 10 may comprise other short-range transceivers, such as, for example an infrared (IR) transceiver 46, a Bluetooth™ (BT) transceiver 48 operating using Bluetooth™ brand wireless technology developed by the Bluetooth™ Special Interest Group, and/or the like. The Bluetooth transceiver 48 may be capable of operating according to Wibree™ radio standards. In this regard, the mobile terminal 10 and, in particular, the short-range transceiver may be capable of transmitting data to and/or receiving data from electronic devices within a proximity of the mobile terminal 10, such as within ten meters, for example. Although not shown, the mobile terminal 10 may be capable of transmitting and/or receiving data from electronic devices according various wireless networking techniques, including Wireless Fidelity (Wi-Fi), WLAN techniques such as IEEE 802.11 techniques, and/or the like.

In an exemplary embodiment, the mobile terminal 10 may also include one or more magnetic field sensors (e.g., sensor 36). The magnetic field sensor 36, according to one embodiment of the present invention, may be a Hall Effect sensor. The sensor 36 may detect magnetic field emission that is transmitted from a short-range communication source, such as a tag (e.g., a radio frequency identification (RFID) tag) or the transceiver of a similar mobile terminal. It should be noted that also other means for sensing the magnetic field can be used, such as for example a Reed switch, which typically consists of a pair of flexible, ferromagnetic contacts hermetically sealed in an inert gas filled container. The magnetic field magnetizes the contacts and causes them to attract each other, closing the circuit to provide an output signal for magnetic field detection. The mobile terminal 10 may also include a switch 38 that may be in communication with and under the control of the controller 20. As such, the switch 38 may be included in the controller 20 or separate from, but in communication with, the controller 20, such as via any type of wireline and/or wireless techniques known to those skilled in the art. In addition to other functions, the switch 38 may be capable of changing an operational mode of any of the short-range communication readers (e.g., RF transceiver 44, the IR transceiver 46, or the BT transceiver 48). The detection of the magnetic field by the sensor 36 may affect a change in the switch 38, which in turn may affect the operational mode of a short-range reader, such as readers 44, 46 and/or 48, such as by activating the transceiver or increasing the frequency of its operation. For example, in one embodiment, detection of the magnetic field by sensor 36 may affect a change in the switch 38 that changes the operational mode of one of readers from a low-power "sleep" mode to a full-power active mode. In other embodiments, the switch 38 may change the operational mode of any one of the short-range communication units among any other operational modes known to those skilled in the art.

In one embodiment of the invention, the controller 20 may rely on mobile terminal parameters, i.e., measured and/or sensed data, to determine whether the detected magnetic field requires activation of a short-range communication module. The mobile terminal 10 may typically encounter various magnetic fields that are not associated with short-range communication sources. As such, the detection of the magnetic fields not associated with short-range communication sources will typically not require the activation of a short-range communication module. In this regard, other sensors such as motion sensors or the like (not shown in FIG. 1) may be in communication with the controller 20 and provide the controller 20 with mobile terminal parameter data. For example, a motion sensor may provide an input to the controller 20 that the device is either in motion or stationary. In this regard, the measured and/or sensed data may then be utilized, by the controller 20, to determine a context and/or change in context of the mobile terminal. The measured and/or sensed data may be utilized according to one exemplary embodiment to delegate the determined changes in the context to different destinations, such as the RF transceiver 44, the IR transceiver 46, or the BT transceiver 48, utilizing context exchange architecture. Alternatively, the sensed data may be transmitted and interpreted by any other suitable application capable of providing the necessary signal to switch 38.

Once the corresponding reader or transceiver has been activated, the mobile terminal 10 may optionally be provided with a means for tactically notifying the user of the mobile terminal 10 that the short-range communication module has been activated or that the operational mode has been altered. The means for notifying the user may include vibration pulse feedback, audio feedback, visual feedback or any other suitable means for tactically providing feedback to the user that the short-range communication module is active.

Figure 2:
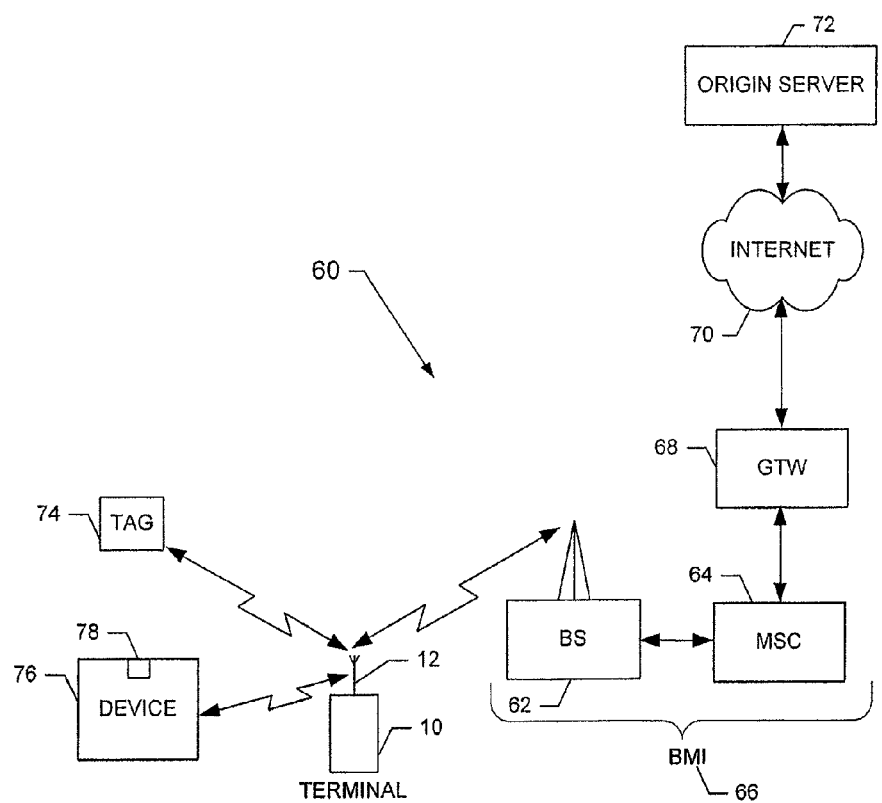
FIG. 2 is a schematic block diagram of a wireless communications system according to an exemplary embodiment of the present invention.

An exemplary embodiment of the invention will now be described in the context of a short range wireless communication system as shown in FIG. 2. More specifically, one exemplary embodiment will be described in the context of a high-data rate RFID system. Furthermore, the encoding scheme described in greater detail below may be employed in a system that uses, for example, on-off keying (OOK), amplitude shift keying (ASK), frequency shift keying (FSK) modulation or the like. However, it should be noted that embodiments could also be practiced in other communication systems and with other modulation schemes.

Referring to FIG. 2, a block diagram of a broadcast network, a short-range communication network and a cellular network, collectively referred to as composite network 60 is shown, in accordance with an embodiment of the present invention. It is noted that while a cellular network is not an essential part of the present invention, it is shown in this figure to illustrate that the short-range communication reader device, which in this example is a cellular terminal (e.g., the mobile terminal 10 of FIG. 1), may be readily equipped to communicate via a cellular network in addition to the short-range communication medium. The cellular network may be utilized in those embodiments in which the short-range communication content includes a link to a network resource. In alternate embodiments, the cellular network may be omitted. The composite network 60 may typically include a plurality of terminals, although for the sake of clarity only one terminal is shown in FIG. 2. As shown, the mobile terminal 10 may include an antenna 12 for transmitting and receiving both cellular network signals and short-range communication signals. However, as an alternative, the antenna 12 may represent multiple antennas so that separate antennas may be used for cellular and short-range communication signals.

The cellular communication network may include a base site or base station (BS) 62. The base station 62 may be a part of a cellular network that includes elements required to operate the network, such as a mobile switching center (MSC) 64. As is known by those of ordinary skill in the art of telecommunications, the cellular network may also be referred to as a Base Station, Mobile Switching Center and Interworking function (BMI) 66. In operation, the MSC 64 may be capable of routing calls and messages to and from the mobile terminal 10 when the mobile terminal 10 is making and receiving calls. The MSC 64 may also provide a connection to landline trunks when the mobile terminal 10 is involved in a call. Further, the MSC 64 can, but need not, be coupled to a server GTW 68 (Gateway).

The MSC 18 can be coupled to a network, such as a local area network (LAN), a metropolitan area network (MAN), and/or a wide area network (WAN). The MSC 64 can be coupled to the network directly, or if the system includes the GTW 68, the MSC 64 can be coupled to the network via the GTW 68. In one configuration, for example, the MSC 64 is coupled to the GTW 68, and the GTW 68 is coupled to a WAN, such as the Internet 70. In turn, devices such as processing elements (e.g., personal computers, server computers or the like) can be coupled to the mobile terminal 10 via the Internet 70. For example, the processing elements can include one or more processing elements associated with an origin server 72.

In addition to optional cellular network communication, the mobile terminal 10 of embodiments of the present invention may be equipped to communicate with other devices via short-range communication techniques (e.g., using any of the RF transceiver 44, the IR transceiver 46, or the BT transceiver 48). The short range communication techniques include, but are not limited to RFID, Bluetooth™ (i.e., communication in the about 2.4 GHz frequency band), Infrared (IR), Wireless Local Area Network (WLAN), IrDA (Infrared Data Association), UWB (Ultra Wideband), or the like. In an exemplary embodiment, as shown in FIG. 2, the mobile terminal 10 may be in short-rang communication with a transponder, e.g., tag 74, and/or a device 76 equipped with internal short-range transponder/tag 78 through a short-range interface. As will be appreciated, the electronic devices and tags can comprise any of a number of different known devices and tags capable of transmitting and/or receiving data in accordance with any of a number of different short-range communication techniques. In one exemplary embodiment, the transponder and/or the device 76 may be RFID components.

Figure 3:
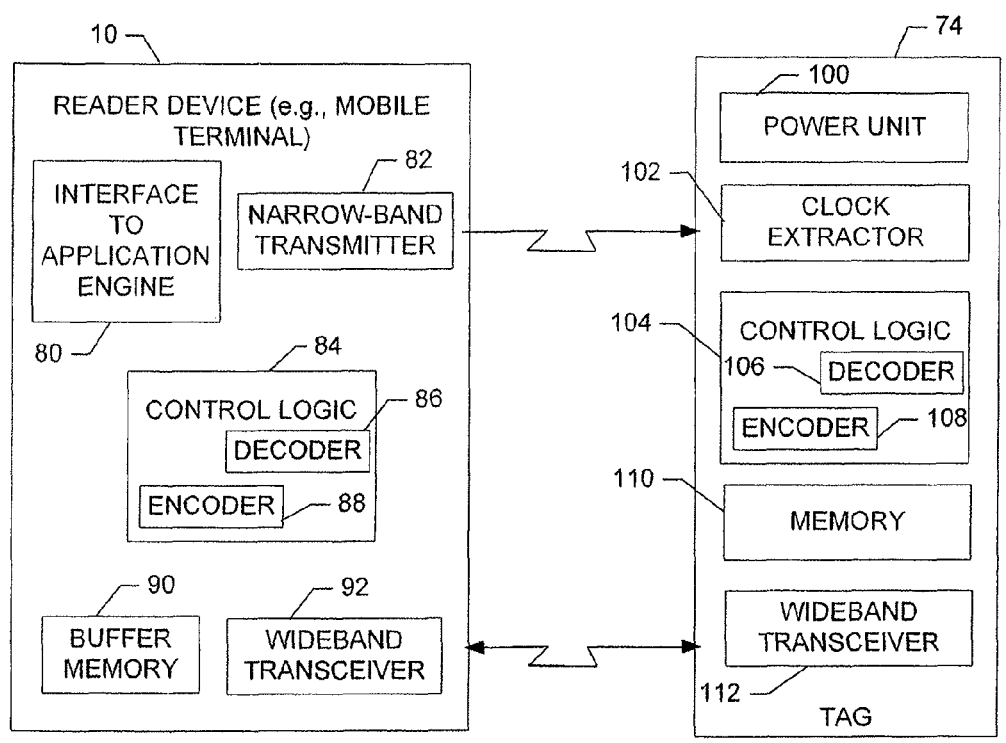
FIG. 3 illustrates a block diagram showing a short range communication system employing an encoder and a decoder according to an exemplary embodiment of the present invention.

One exemplary embodiment of the present invention will now be described in greater detail in reference to a short range communication system as shown in FIG. 3. In this regard, the system may include a first device, which may be a reader device (e.g., the mobile terminal 10) and a second device, which may be an RFID tag (e.g., the tag 74). In an exemplary embodiment in which the reader device is the mobile terminal 10, the reader device may include an interface to application engine 80, which may interface between the components of the reader device in FIG. 3 and the other components of the mobile terminal 10. For example, the interface to application engine 80 may represent a logical and/or physical interface between control logic (e.g., local processor or co-processor) 84 and the other shown components of the reader device and the controller 20 or processor of the mobile terminal 10. Processors such as those described herein may be embodied in many ways. For example, the processors may be embodied as a processing element, a coprocessor, a controller or various other processing means or devices including integrated circuits such as, for example, an ASIC (application specific integrated circuit) or an FPGA (field programmable gate array).

The reader device may also include the control logic 84, a memory buffer 90, a narrow-band transmitter 82 and/or a wideband transceiver 92. In an exemplary embodiment, the control logic 84 may include or otherwise control a decoder 86 and an encoder 88. Each of the decoder 86 and the encoder 88 may be any device or means embodied in hardware, software or a combination of hardware and software that is configured to perform the corresponding functions of the decoder 86 and the encoder 88, respectively, as described below. In this regard, for example, the encoder 88 may be configured to encode input data such as input words or input sequences of a given number of bits in accordance with embodiments of the present invention for improved power efficiency. Meanwhile, the decoder 86 may be configured to decode received data that has been encoded by the encoder 88. The encoder 88 and decoder 86 will be described in greater detail below. Although the encoder 88 and decoder 86 are illustrated in FIG. 3 as being a part of or controlled by the control logic 84, the encoder 88 and/or decoder 86 could alternatively be separate devices or part of the wideband transceiver 92.

The memory buffer 90 may include, for example, volatile and/or non-volatile memory (e.g., volatile memory 40 and/or non-volatile memory 42). The memory buffer 90 may be configured to store information, data, applications, instructions or the like for enabling the apparatus to carry out various functions in accordance with exemplary embodiments of the present invention. For example, the memory buffer 90 could be configured to buffer input data for processing by the control logic 84, the encoder 86 and/or the decoder 88. Additionally or alternatively, the memory buffer 90 could be configured to store instructions for execution by the control logic 84.

The narrow-band transmitter 82 may be any device or means embodied in hardware, software or a combination of hardware and software that is configured to enable the reader device to transmit a wireless transmission signal (e.g., a 13.56 or 900 MHz signal) such as for interrogating near field communication (NFC) tags or electronic product code (EPC) Global tags. Meanwhile, the wideband transceiver 92 may provide high data rate communication between the reader device and the tag 74. In this regard, for example, the wideband transceiver 92 may provide impulse UWB communication between the reader device and the tag 74. Although impulse UWB and typical RFID communication frequencies are referred to in this example, it should be noted that, as indicated above, other communications systems, and therefore other transceivers, could alternatively be used.

The tag 74 may include a power unit 100, a clock extractor 102, control logic 104 (which may further include a decoder 106 and an encoder 108), memory 110, and/or a wideband transceiver 112. The control logic 104, the decoder 106, the encoder 108 and the wideband transceiver 112 may operate in a substantially similar fashion to the operation described above for the control logic 84, the decoder 86, the encoder 88 and the wideband transceiver 92 of the reader device. Accordingly, a redundant description of these components will not be presented.

The clock extractor 102 may be configured to extract or recover a carrier signal received at the tag 74 and determine a clock frequency associated therewith. The determinations made by the clock extractor 102 may be communicated to the control logic 104 for use in decoding and/or encoding operations. The memory 110 may be, for example, volatile and/or non-volatile memory configured to store information, data, instructions or the like for enabling the tag 74 to carry out various functions in accordance with exemplary embodiments of the present invention. For example, the memory 110 could be configured to buffer input data for processing by the control logic 84, the encoder 86 and/or the decoder 88.

The power unit 100 may, for example, include a rectifier configured to rectify received transmission signals (e.g., narrow-band signals received from the narrow-band transmitter 82) to generate power for the tag 74. As such, the tag 74 of FIG. 3 may be assumed to be a passive device that generates power from received signals rather than having an onboard power source (e.g., battery). Since the tag 74 generates its power from the signals it receives, the tag 74 typically has very limited power resources (e.g., usually only a few milliwatts). As such, it may be clear why it may be considered advantageous to reduce power consumption in such a device in certain situations. However, it should be noted that embodiments of the present invention may also be practiced with devices that have onboard batteries or even external power sources.

The encoders 88 and 108 and the decoders 86 and 106 will now be described in greater detail to explain an exemplary embodiment. To simplify the description, the encoder 88 of the reader device and the decoder 106 of the tag 74 will be described below, but it should be appreciated that, except where specifically noted, the encoder 108 of the tag 74 and the decoder 86 of the reader device may function in a similar fashion to the corresponding encoder 88 and decoder 106 of the reader device and the tag 74, respectively. The encoder 88 and the decoder 106 may be capable of communication with each other (e.g., via the respective wideband transceivers). The encoder 88 may be employed to encode data (e.g., speech data, audio data, video data, image data, etc.) and the decoder 106 may be employed to decode encoded data.

The encoder 88 may be any means or device embodied in hardware, software or a combination of hardware and software that is capable of performing encoding operations as described below. In this regard, input data of a given number of bits (e.g., N-bits, where N is an integer constant) may be encoded in a manner that may reduce power consumption. In this regard, for example, since it generally requires more power or energy to transmit a digital "one" (or high) value modulated onto a carrier than the power or energy required to transmit a digital "zero" (or low) value, embodiments of the present invention enable encoding of the input data (e.g., an input word) in a manner that ensures that not more than half of the bits transmitted for a given input word will be high value bits. As such, for example, if more than half of the bits of the input word (e.g., >N/2) have a high value, the entire input word may be encoded by inverting the bit values and adding an indication bit to indicate the status of encoding (e.g., indicating that an inversion has been performed). Meanwhile, if half or less then half of the bits of the input word (e.g., ≦N/2) initially have high values, the input word is encoded by adding only the indication bit to indicate the status of encoding (e.g., indicating that no inversion has been performed). Accordingly, in an exemplary embodiment, the number of high values, or one values in the encoded data may be reduced. For example, assuming that N=8 and the input data bits are '10110110', the encoded data is '01001001'. In this case, the input data contains five one values and the encoded data contains only three one values.

The decoder 106 may be any device or means embodied in either hardware, software, or a combination of hardware and software that is capable of performing decoding operations as described below. In an exemplary embodiment, the decoder 106 may be embodied in software as instructions that are stored on the memory 110 of the tag 74 and executed by the control logic 104. In an alternative exemplary embodiment, the decoder 106 may be embodied in digital hardware. The decoder 106 may be configured to examine incoming data (e.g., encoded input words) and determine whether such data includes inverted data. If the incoming data includes inverted data, the decoder 106 may invert the incoming data to restore the original values that existed prior to encoding. The output of the decoder 106 may also be stripped of the inversion indication bit.

Figure 4:
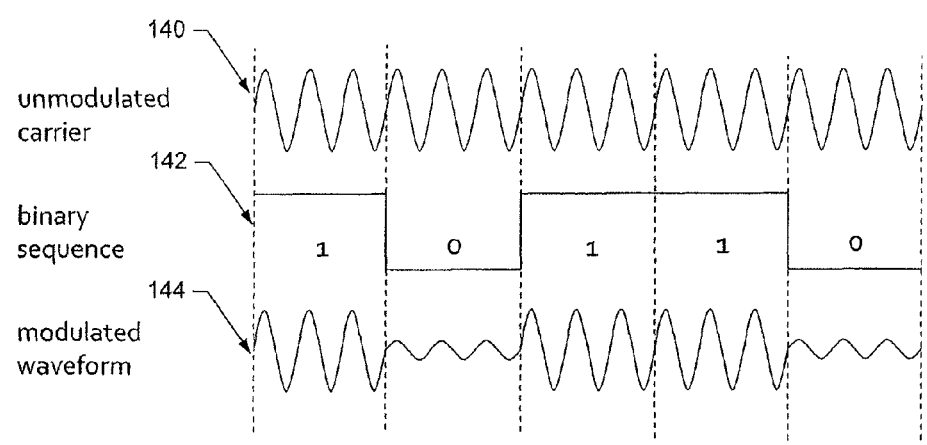
FIG. 4 illustrates an example of an amplitude shift keying modulated waveform generated from the modulation of an unmodulated carrier with a binary sequence to produce a modulated waveform for transmission according to an exemplary embodiment of the present invention.

FIG. 4 illustrates an example of an ASK modulated waveform generated from the modulation of an unmodulated carrier 140 with a binary sequence 142 (in this case 10110) to produce a modulated waveform 144 for transmission. The modulation of the unmodulated carrier 140 according to the binary sequence 142 may be accomplished so that during a '0' bit, the carrier is attenuated so that the amplitude is notably smaller than during a '1' bit. There are many options to define the relative power levels corresponding to '0' and '1' bits. For example, a '1' bit could be transmitted at 100% power (e.g., full carrier signal power) and '0' symbol may be transmitted at 10% of the full carrier signal power. In any case, it is clear that transmitting a '1' symbol consumes more power than transmitting a '0' symbol.

Figure 5:
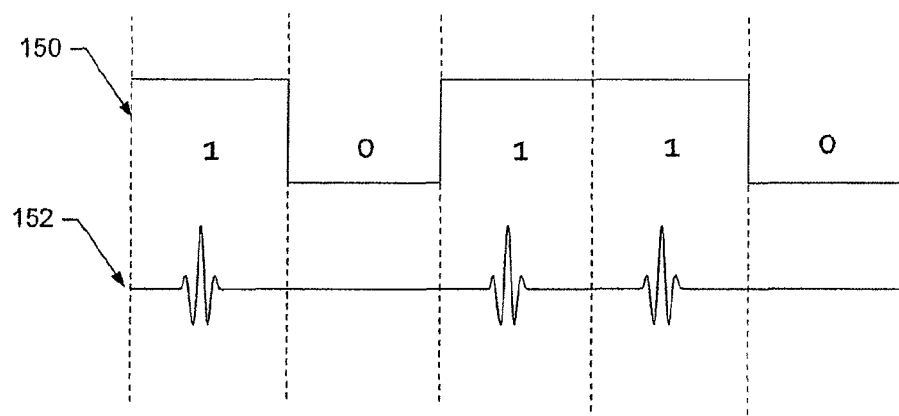
FIG. 5 illustrates an example of on-off keying modulation corresponding to a binary sequence to produce an impulse ultra wideband signal according to an exemplary embodiment of the present invention.

FIG. 5 illustrates an example of OOK modulation (e.g., in an impulse UWB system) corresponding to a binary sequence 150 (again in this example, 10110) to produce an impulse UWB signal 152. During a '1' symbol, a short impulse is transmitted and during a '0' symbol nothing is transmitted. (This can be considered as an extreme case of ASK modulation where the amplitude of a '0' symbol is 0%.) Similar to the ASK modulation of FIG. 4 above, more power is consumed in the transmission of a '1' symbol than is consumed in the transmission a '0' symbol. According to an exemplary embodiment, in either of the examples above of a 5 bit input word (10110), inversion of the input word may result in a power savings by instead encoding the input word as 01001, which has one less high value.

Figure 6:
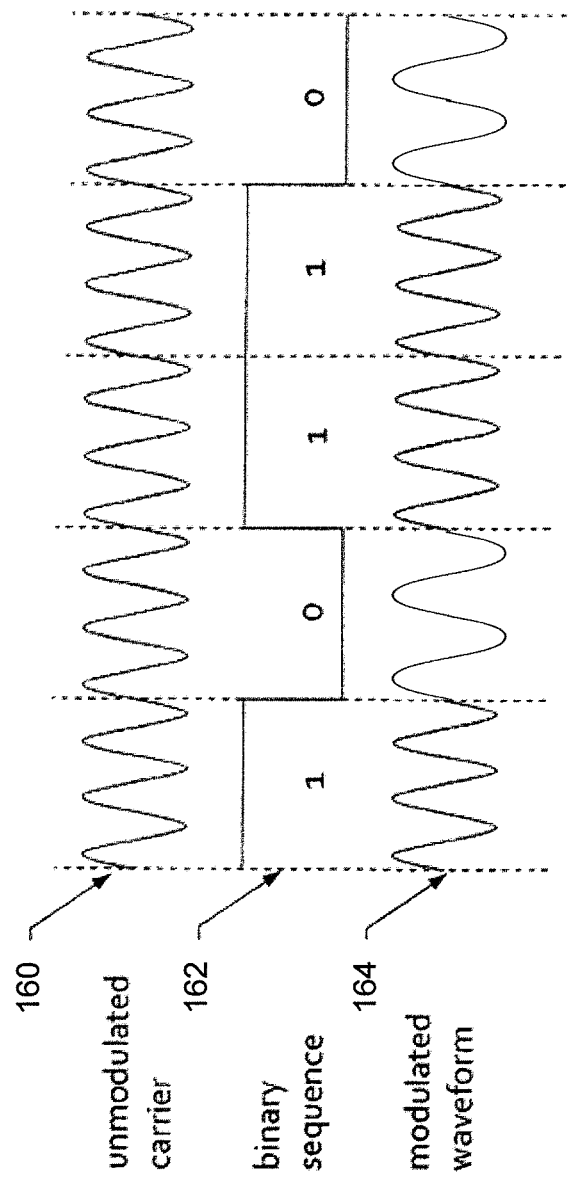
FIG. 6 illustrates an example of frequency shift keying modulation corresponding to a binary sequence to produce a modulated signal according to an exemplary embodiment of the present invention.

FIG. 6 illustrates an example of FSK modulated waveform generated from the modulation of an unmodulated carrier 160 with a binary sequence 162 (in this case 10110) to produce a modulated waveform 164 for transmission. The modulation of the unmodulated carrier 160 according to the binary sequence 162 may be accomplished so that during a '0' bit, the carrier frequency is reduced so that the frequency is notably lower than during a '1' bit. There are many options to define the relative frequencies corresponding to '0' and '1' bits. In any case, it is clear in this example that transmitting a '1' symbol consumes more power than transmitting a '0' symbol.

In order to enable recognition of data that has been inverted at the decoder 106, the encoder 88 may include an inversion indication bit, as described above. The inversion indication bit may be added to any desirable portion of the input word. In some embodiments, the inversion indication bit may be added to either the beginning or the end of the input word. The inversion indication bit may extend the number of bits of the encoded input word to be one bit larger (e.g., N+1). Thus, for example, for a byte (e.g., an input word where N=8), an increase in overhead may be experienced of 12.5% due to the larger size of the encoded input word. However, because the total number of high value bits is reduced as a result of encoding as described above, the overall power consumption may still be reduced.

In an exemplary embodiment, the encoder 88 may be embodied in software as instructions that are stored on the memory buffer 90 of the mobile terminal 10 and executed by the controller 20 or the control logic 84. Alternatively, the encoder 88 may be embodied in digital hardware via a number of different configurations. In any case, the encoder 88 may determine, for a digital input value (e.g., an input word) including a particular number of bits, how many of the bits have a logical one value. The encoder 88 may then encode the input value by inverting each of the bits of the digital input value in response to a determination that more than half of the bits of the digital input value have a logical one value.

In one embodiment, the encoder 88 may be embodied as a look-up-table (LUT). One straightforward way to use a LUT implementation may be to store a polarity bit (e.g., inversion indication bit) of each possible input word in a constant table. As such, the LUT may act as a read-only memory (ROM) where the data to be encoded is connected to an address bus.

The output of the memory may be the polarity bit corresponding to the input word. To handle all possible outcomes for the case when N=8, the LUT may include 256 entries. Each entry may be only 1-bit wide, thus the ROM size may be 256× 1=256 bits, which is relatively small or even negligible in current digital CMOS processes. If the resulting polarity bit indicates inversion, the encoder 88 may invert the input word and if the resulting polarity bit indicates no inversion, the encoder 88 may not invert the input word. The result of the LUT may be experienced as one exemplary method of determining whether more than half of the bits of the input word are ones and providing an indication of whether an inversion is to be performed and/or has been performed.

Table 1 below illustrates all possible input words and corresponding codewords (e.g., encoded input words) in an exemplary case where N=4. In this example, an additional protocol bit (e.g., the polarity or inversion indication bit) that denotes inversion is added to the beginning of the codeword.

TABLE 1

Example of encoding when N = 4

| Input data (4 bits) | Number of '1' bits in input data | Encoded data (1 + 4 bits) | Number of '1' bits in the encoded data | Change in the amount of '1' bits |
|---|---|---|---|---|
| 0000 | 0 | 0 + 0000 | 0 | 0 |
| 0001 | 1 | 0 + 0001 | 1 | 0 |
| 0010 | 1 | 0 + 0010 | 1 | 0 |
| 0011 | 2 | 0 + 0011 | 2 | 0 |
| 0100 | 1 | 0 + 0100 | 1 | 0 |
| 0101 | 2 | 0 + 0101 | 2 | 0 |
| 0110 | 2 | 0 + 0110 | 2 | 0 |
| 0111 | 3 | 1 + 1000 | 2 | −1 |
| 1000 | 1 | 0 + 1000 | 1 | 0 |
| 1001 | 2 | 0 + 1001 | 2 | 0 |
| 1010 | 2 | 0 + 1010 | 2 | 0 |
| 1011 | 3 | 1 + 0100 | 2 | −1 |
| 1100 | 2 | 0 + 1100 | 2 | 0 |
| 1101 | 3 | 1 + 0010 | 2 | −1 |
| 1110 | 3 | 1 + 0001 | 2 | −1 |
| 1111 | 4 | 1 + 0000 | 1 | −3 |

As can be seen from table 1 above, in this example, the number of '1' bits in any codeword is always less or equal than the number of '1' bits in the input data. Accordingly, in this example, the number of '1' bits may be reduced and is never increased as a result of the encoding process.

In order to estimate the efficiency of encoding according to one exemplary embodiment applied on large amounts of data, a study showed that, in one example, the number of '1' bits was reduced by approximately 18-20%. Taking into account the nature of ASK, FSK and OOK modulation and other like modulation techniques as shown, for example, in FIGS. 4, 5 and 6, clear power savings may be achieved by such reductions. However, different data sets may include different amounts of '1' bits and, generally speaking, for a higher number of '1' bits in a given data set there may be a greater potential for power savings. The power savings may be utilized in many ways. For example, a given power budget may utilize the savings in power to provide a higher data rate or an extended operating range of the reader device.

In some exemplary embodiments, modifications to the basic concept of inversion as described above may be employed. For example, since some embodiments may be utilized in the context of devices that may not have power limitations or on a particular set of data that is not desirable for employment of embodiments of the present invention, a mode control capability may be introduced. In this regard, for example, the control logic 84 (or 104) may be enabled to determine whether to employ encoding/decoding according to embodiments of the present invention and/or may be enabled to respond to manual control by a user with regard to employment of encoding/decoding. As such, the user (e.g., the user of the mobile terminal 10) may direct entry into or out of a mode enabling encoding according to embodiments of the present invention. Alternatively, the control logic may be enabled to examine a set of data to be transmitted and, based on such factors as the aggregate number of '1' bits in the set relative to the total number of bits or the aggregate number of input words with more than half of the bits being '1' bits relative to the total number of input words in order to determine whether to initiate encoding according an exemplary embodiment. In this regard, a threshold percentage may be used in either case to initiate encoding.

In some exemplary embodiments in which one device is substantially more power limited than another device such as the tag 74, which generates its power based on received signals, it may be beneficial to encode and decode in only one direction. For example, if the reader is not power limited, or substantially less power limited than the tag 74, the reader may not employ encoding. As a result, a higher power signal may be transmitted to the tag 74 to provide more potential power to the tag 74. Meanwhile, the tag 74 may employ encoding while transmitting to the reader. In either case, the control logic (84 or 104) may be enabled to determine whether encoding is being employed and employ the respective decoder (86 or 106) in order to decode received data when appropriate.

In some embodiments, error detection may be employed at a device receiving an encoded transmission based on the inversion indication bit. In this regard, for example, based on rules associated with input word encoding (e.g., whether or not inversion is employed, an encoded word will have less than half of the total number of bits being a high or '1' bit) there may be certain "illegal" encoded words that may be detected. As such, in one example, a first rule may state that if the inversion indication bit indicates an inversion (e.g., the inversion indication bit is set), then more than half of the other bits must be zero. Meanwhile, a second rule may state that if the inversion indication bit indicates no inversion (e.g., the inversion indication bit is not set), then at least half of the other bits must be zero. According to this example, assuming that N=8 the following codeword is not legal: "1+00001111", because the codeword violates the first rule listed above. The decoder (86 or 106) may then conclude that at least one of the bit values has been corrupted during transmission and handle the error in some way. In one exemplary embodiment, the decoder may identify the erroneous codeword to upper protocol layers so that the corrupted data can be re-transmitted. Another example of an illegal codeword is "0+11010111", which violates the second rule above. As such, the above described error detection technique alone, while not capable of detecting every error, can be utilized alone or combined with other higher-level error detection and/or correction techniques such as CRC checksum calculation on blocks of data to provide error detection capability. In an exemplary embodiment, one benefit of employing such error detection may be that if a low-level error detector detects even one erroneous data item, there may be no need to pass the whole data block to the CRC checker, which may save both energy and time.

Figure 7:
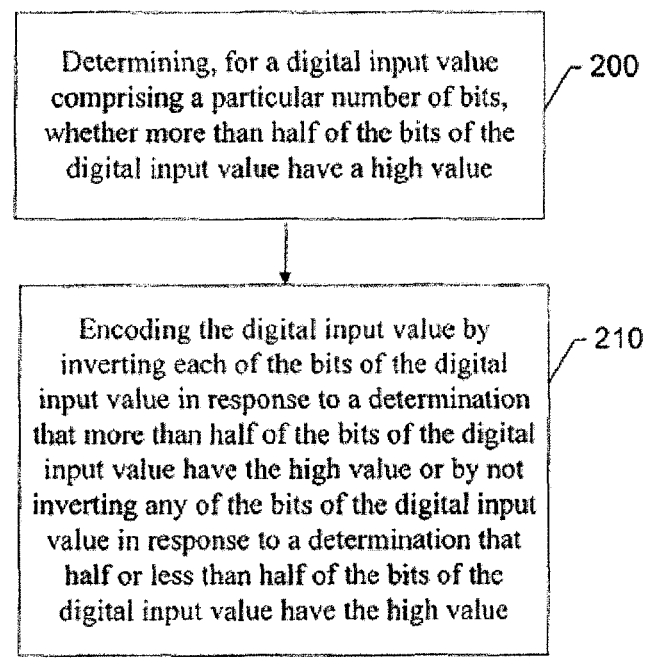
FIG. 7 illustrates a method of providing an encoding scheme for power reduction in accordance with an embodiment of the present invention.
Figure 8:
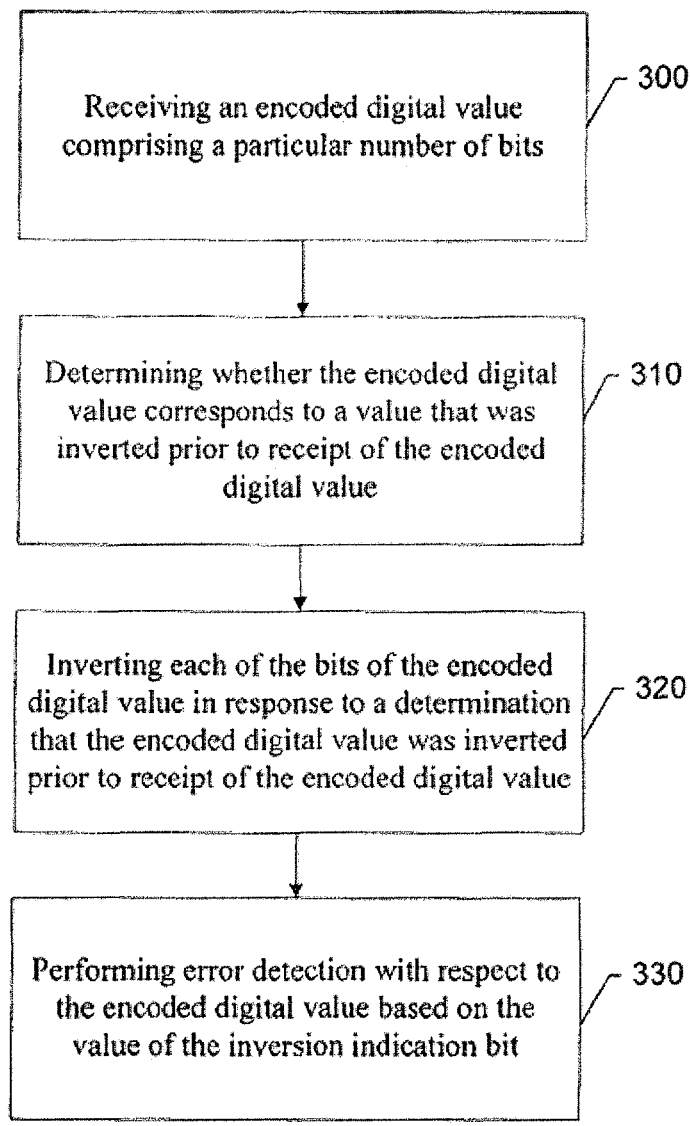
FIG. 8 illustrates a method of providing a decoding scheme for power reduction in accordance with an embodiment of the present invention.

FIGS. 7 and 8 are flowcharts of methods and program products according to exemplary embodiments of the invention. It will be understood that each block or step of the flowcharts, and combinations of blocks in the flowcharts, can be implemented by various means, such as hardware, firmware, and/or software including one or more computer program instructions. For example, one or more of the procedures described above may be embodied by computer program instructions. In this regard, the computer program instructions which embody the procedures described above may be stored by a memory device of the mobile terminal and executed by a built-in processor in the mobile terminal. As will be appreciated, any such computer program instructions may be loaded onto a computer or other programmable apparatus (i.e., hardware) to produce a machine, such that the instructions which execute on the computer or other programmable apparatus create means for implementing the functions specified in the flowcharts block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowcharts block(s) or step(s). The computer program instructions may also be loaded onto a computer or other programmable apparatus to cause a series of operational steps to be performed on the computer or other programmable apparatus to produce a computer-implemented process such that the instructions which execute on the computer or other programmable apparatus provide steps for implementing the functions specified in the flowcharts block(s) or step(s).

Accordingly, blocks or steps of the flowcharts support combinations of means for performing the specified functions, combinations of steps for performing the specified functions and program instruction means for performing the specified functions. It will also be understood that one or more blocks or steps of the flowcharts, and combinations of blocks or steps in the flowcharts, can be implemented by special purpose hardware-based computer systems which perform the specified functions or steps, or combinations of special purpose hardware and computer instructions.

In this regard, one embodiment of a method for providing a data encoding scheme for reducing power consumption, as illustrated in FIG. 7, may be implemented from the perspective of a first device such as a reader device or mobile terminal. However, the method of FIG. 7 may also be implemented on a second device such as a tag or RFID transponder. The method may include determining, for a digital input value comprising a particular number of bits, whether more than half of the bits of the digital input value have a high value at operation 200. The method may further include encoding the digital input value by inverting each of the bits of the digital input value in response to a determination that more than half of the bits of the digital input value have the high value at operation 210. Operation 210 may include an alternative operation of not inverting any of the bits of the digital input value in response to a determination that half or less than half of the bits of the digital input value have the high value.

In an exemplary embodiment, encoding may further include adding an inversion indicator (e.g., an inversion indication bit) to the encoded digital input value. The inversion indication bit may have two possible values including a first value indicative of an inversion being applied to the digital input value and a second value indicative of no inversion being applied to the digital input value. In another exemplary embodiment, determining whether more than half of the bits have the high value may include comparing the digital input value to a table value. In this regard, for example, a value of the inversion indication bit may be determined based on the comparing.

FIG. 8 illustrates a method of providing a data decoding scheme for reducing power consumption from the perspective of the second device such as a tag or RFID transponder in communication with an apparatus performing the method of FIG. 7 in accordance with an embodiment of the present invention. However, the decoding scheme could also be employed on the first device above. As indicated in FIG. 8, the method may include receiving an encoded digital value comprising a particular number of bits at operation 300 and determining whether the encoded digital value corresponds to a value that was inverted prior to receipt of the encoded digital value at operation 310. The method may further include inverting each of the bits of the encoded digital value in response to a determination that the encoded digital value was inverted prior to receipt of the encoded digital value at operation 320. In an exemplary embodiment, receiving the encoded digital value may include receiving an inversion indicator (e.g., an inversion indication bit) in addition to the encoded digital value. The inversion indication bit may have two possible values including a first value indicative of an inversion having been applied to the encoded digital value and a second value indicative of no inversion having been applied to the encoded digital value. In some embodiments, determining whether the encoded digital value corresponds to the value that was inverted prior to receipt of the encoded digital value may include determining whether the inversion indication bit has the first value or the second value. In an exemplary embodiment, the method may include an additional operation of performing error detection with respect to the encoded digital value based on the value of the inversion indication bit at operation 330.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
   determining, for a digital input value comprising a particular number of bits, the particular number of bits in the digital input value;
   determining a number of bits which have a high value;
   determining, utilizing a processor, whether the number of bits which have a high value is more than half of the particular number of bits in the digital input value; and
   encoding the digital input value by inverting each of the bits of the digital input value in response to a determination that the number of bits which have a high value is more than half of the particular number of bits in the digital input value, wherein encoding the digital input value further comprises adding an inversion indicator to the encoded digital input value, the inversion indicator having two possible values including a first value indicative of an inversion being applied to the digital input value and a second value indicative of no inversion being applied to the digital input value.

2. The method of claim 1, wherein determining whether more than half of the bits have the high value comprises comparing the digital input value to a table value and wherein a value of the inversion indicator is determined based on the comparing.

3. The method of claim 1, wherein encoding further comprises not inverting any of the bits of the digital input value in response to a determination that the number of bits which have a high value is half of or less than half of the particular number of bits in the digital input.

4. A computer program product comprising at least one non-transitory computer-readable storage medium having computer-readable program code portions stored therein, the computer-readable program code portions comprising:
   a first executable portion for determining, for a digital input value comprising a particular number of bits, the particular number of bits in the digital input value,
   a second executable portion for determining a number of bits which have a high value:
   a third executable portion for determining whether the number of bits which have a high value is more than half of the particular number of bits in the digital input value; and
   a fourth executable portion for encoding the digital input value by inverting each of the bits of the digital input value in response to a determination that the number of bits which have a high value is more than half of the particular number of bits in the digital input value, wherein the second executable portion includes instructions for adding an inversion indicator to the encoded digital input value, the inversion indicator having two possible values including a first value indicative of an inversion being applied to the digital input value and a second value indicative of no inversion being applied to the digital input value.

5. The computer program product of claim 4, wherein the third executable portion includes instructions for comparing the digital input value to a table value and wherein a value of the inversion indicator is determined based on the comparing.

6. The computer program product of claim 5, wherein the fourth executable portion includes instructions for not inverting any of the bits of the digital input value in response to a determination that the number of bits which have a high value is half of or less than half of the particular number of bits in the digital input value.

7. An apparatus, comprising:
   at least one processor; and
   at least one memory including computer program code,
   the at least one memory and the computer program code configured to, with the at least one processor, cause the apparatus to perform at least the following:
   determine, for a digital input value comprising a particular number of bits, the particular number of hits in the digital input value;
   determine a number of bits which have a high value;
   determine whether the number of bits which have a high value is more than half of the particular number of bits in the digital input value; and
   encode the digital input value by inverting each of the bits of the digital input value in response to a determination that the number of bits which have a high value is more than half of the particular number of bits in the digital input value, wherein encode the digital input value further comprises adding an inversion indicator to the encoded digital input value, the inversion indicator having two possible values including a first value indicative of an inversion being applied to the digital input value and a second value indicative of no inversion being applied to the digital input value.

8. The apparatus of claim 7, wherein the at least one memory and the computer program code are further configured for comparing the digital input value to a table value and wherein a value of the inversion indicator is determined based on the comparing.

9. The apparatus of claim 7, wherein the at least one memory and the computer program code are further configured to, with the at least one processor, cause the apparatus to encode the digital input value by not inverting any of the bits of the digital input value in response to a determination that the number of bits which have a high value is half of or less than half of the particular number of bits in the digital input value.

10. A method comprising:
receiving an encoded digital value comprising a particular number of bits;
determining, utilizing a processor, whether the encoded digital value corresponds to a value that was inverted prior to receipt of the encoded digital value, wherein the inversion is based on a determination of whether a number of bits which have a high value is more than half of a particular number of bits in the digital input value; and
inverting each of the bits of the encoded digital value in response to a determination that the encoded digital value was inverted prior to receipt of the encoded digital value, wherein receiving the encoded digital value comprises receiving an inversion indicator in addition to the encoded digital value, the inversion indicator having two possible values including a first value indicative of an inversion having been applied to the encoded digital value and a second value indicative of no inversion having been applied to the encoded digital value.

11. The method of claim 10, wherein determining whether the encoded digital value corresponds to the value that was inverted prior to receipt of the encoded digital value comprises determining whether the inversion indicator has the first value or the second value.

12. The method of claim 10, further comprising performing error detection with respect to the encoded digital value based on the value of the inversion indicator.

13. An apparatus, comprising:
at least one processor; and
at least one memory including computer program code,
the at least one memory and the computer program code configured to, with the at least one processor, cause the apparatus to perform at least the following:
receive an encoded digital value comprising a particular number of bits;
determine whether the encoded digital value corresponds to a value that was inverted prior to receipt of the encoded digital value, wherein the inversion is based on a determination of whether a number of bits which have a high value is more than half of a particular number of bits in the digital input value; and
invert each of the bits of the encoded digital value in response to a determination that the encoded digital value was inverted prior to receipt of the encoded digital value, wherein receive the encoded digital value comprises receiving an inversion indicator in addition to the encoded digital value, the inversion indicator having two possible values including a first value indicative of an inversion having been applied to the encoded digital value and a second value indicative of no inversion having been applied to the encoded digital value.

14. The apparatus of claim 13, wherein determine whether the encoded digital value corresponds to the value that was inverted prior to receipt of the encoded digital value comprises determining whether the inversion indicator has the first value or the second value.

15. The apparatus of claim 13, wherein the at least one memory and the computer program code are further configured to, with the at least one processor, cause the apparatus to perform error detection with respect to the encoded digital value based on the value of the inversion indicator.

16. A computer program product comprising at least one non-transitory computer-readable storage medium having computer-readable program code portions stored therein, the computer-readable program code portions comprising:
a first executable portion for receiving an encoded digital value comprising a particular number of bits;
a second executable portion for determining whether the encoded digital value corresponds to a value that was inverted prior to receipt of the encoded digital value, wherein the inversion is based on a determination of whether a number of bits which have a high value is more than half of a particular number of hits in the digital input value; and
a third executable portion for inverting each of the bits of the encoded digital value in response to a determination that the encoded digital value was inverted prior to receipt of the encoded digital value, wherein the first executable portion includes instructions for receiving an inversion indicator in addition to the encoded digital value, the inversion indicator having two possible values including a first value indicative of an inversion having been applied to the encoded digital value and a second value indicative of no inversion having been applied to the encoded digital value.

17. The computer program product of claim 16, wherein the second executable portion includes instructions for determining whether the inversion indicator has the first value or the second value.

18. The computer program product of claim 16, further comprising a fourth executable portion for performing error detection with respect to the encoded digital value based on the value of the inversion indicator.

* * * * *

UNITED STATES PATENT AND TRADEMARK OFFICE
CERTIFICATE OF CORRECTION

PATENT NO. : 8,483,311 B2
APPLICATION NO. : 12/921377
DATED : July 9, 2013
INVENTOR(S) : Varteva It is certified that error appears in the above-identified patent and that said Letters Patent is hereby corrected as shown below:

In the Claims:

Column 16,
Line 57, "number of hits" should read --number of bits--.

Column 18,
Line 36, "number of hits" should read --number of bits--.

Signed and Sealed this
Twenty-ninth Day of October, 2013

Teresa Stanek Rea
*Deputy Director of the United States Patent and Trademark Office*